United States Patent [19]
Peterson et al.

[11] Patent Number: 5,965,682
[45] Date of Patent: Oct. 12, 1999

[54] FIBERS MADE FROM LONG CHAIN BRANCHED SYNDIOTACTIC VINYL AROMATIC POLYMERS

[75] Inventors: Curtis E. Peterson; Yi-Bin Huang, both of Midland, Mich.; Roel H. Vossen, Hulst, Netherlands; Paul J. Moses, Jr., Lake Jackson, Tex.

[73] Assignee: The Dow Chemical Company, Midland, Mich.

[21] Appl. No.: 09/037,415

[22] Filed: Mar. 10, 1998

Related U.S. Application Data

[60] Provisional application No. 60/048,080, May 30, 1997.
[51] Int. Cl.$^6$ .............................. C08F 12/08; B32B 27/02; C08L 63/02
[52] U.S. Cl. ........................... 526/346; 428/290; 428/413; 428/473.5; 428/500; 428/516; 428/901; 525/122; 525/184; 525/422
[58] Field of Search .............................. 526/346; 525/122, 525/184, 422; 428/290, 413, 473.5, 500

[56] References Cited

U.S. PATENT DOCUMENTS

| | | | |
|---|---|---|---|
| 4,313,832 | 2/1982 | Shimizu et al. ........................ | 210/663 |
| 5,021,288 | 6/1991 | Jezic ........................................ | 428/224 |
| 5,079,075 | 1/1992 | Yamasaki et al. ...................... | 428/224 |
| 5,145,631 | 9/1992 | Jezic ........................................ | 264/518 |
| 5,156,797 | 10/1992 | Yamasaki et al. ...................... | 264/518 |
| 5,202,402 | 4/1993 | Funaki et al. .......................... | 526/336 |
| 5,610,455 | 3/1997 | Allen et al. ............................. | 307/400 |

FOREIGN PATENT DOCUMENTS

| | | |
|---|---|---|
| 08081829 | of 1996 | Japan . |
| 08143730 | of 1996 | Japan . |
| WO9808881 | 3/1998 | WIPO . |

OTHER PUBLICATIONS

Research Disclosure 390037 A, Oct. 10, 1996, Syndiotactic polystyrene for filters and nonwovens.

*Primary Examiner*—Robert E. Sellers

[57] ABSTRACT

Fibers having increased strength and small diameters can be produced from compositions comprising long chain branched syndiotactic vinyl aromatic polymers derived from the polymerization of a vinyl aromatic monomer in the presence of from 10 to 1000 ppm, based on the amount of vinyl aromatic monomer, of a multifunctional monomer having more than one olefinic functionality. Due to the increased fiber strength, less strand breakage occurs during processing which increases process productivity and yield.

4 Claims, No Drawings

FIBERS MADE FROM LONG CHAIN BRANCHED SYNDIOTACTIC VINYL AROMATIC POLYMERS

CROSS-REFERENCE STATEMENT

This application claims the benefit of U.S. Provisional Application Ser. No. 60/048,080, filed May 30, 1997.

BACKGROUND OF THE INVENTION

The present invention relates to syndiotactic vinyl aromatic polymer fibers and applications thereof.

Syndiotactic vinyl aromatic polymers such as syndiotactic polystyrene (SPS) are useful polymers having a high melting point and crystallization rate as well as excellent heat and chemical resistance. However, in some applications such as in cast-tenter films and fibers, the melt strength is insufficient at processing temperatures to obtain desirable properties.

Syndiotactic copolymers have also been developed having superior heat and chemical resistance. U.S. Pat. No. 5,202,402 issued to Funaki et al. utilizes a difunctional monomer to form a syndiotactic copolymer with styrene, however, the polymer fully crosslinks at high temperatures, forming a thermoset and cannot be melt processed.

Fibers have been made previously from linear syndiotactic vinyl aromatic polymers as described in U.S. Pat. No. 5,145,631 and U.S. Pat. No. 5,021,288 issued to Jezic. However, due to melt strength limitations, these fibers are limited by their diameter and strength.

Therefore, it would be useful to obtain fibers having smaller fiber diameters, increased strength and improved processability, from a syndiotactic vinyl aromatic polymer which retains good melt strength and melt processability at high temperatures.

SUMMARY OF THE INVENTION

The present invention is directed to fibers made from a composition comprising a long chain branched syndiotactic vinyl aromatic (LCB-SVA) polymer and articles made therefrom.

Long chain branched syndiotactic vinyl aromatic polymers can be melt processed at high temperatures while maintaining good melt strength and can be used to make fibers having smaller fiber diameter and increased strength when compared to fibers made from linear syndiotactic vinyl aromatic polymers. Additionally, due to the increase fiber strength, less strand breakage occurs during processing which increases process productivity and yield.

DESCRIPTION OF THE PREFERRED EMBODIMENTS

In one embodiment, the present invention relates to fibers made from a composition comprising a long chain branched syndiotactic vinyl aromatic (LCB-SVA) polymer.

As used herein, the term "syndiotactic" refers to polymers having a stereoregular structure of greater than 90 percent syndiotactic, preferably greater than 95 percent syndiotactic, of a racemic triad as determined by $^{13}C$ nuclear magnetic resonance spectroscopy.

Syndiotactic vinyl aromatic polymers are homopolymers and copolymers of vinyl aromatic monomers, that is, monomers whose chemical structure possess both an unsaturated moiety and an aromatic moiety. The preferred vinyl aromatic monomers have the formula

wherein R is hydrogen or an alkyl group having from 1 to 4 carbon atoms, and Ar is an aromatic radical of from 6 to 10 carbon atoms. Examples of such vinyl aromatic monomers are styrene, alpha-methylstyrene, ortho-methylstyrene, meta-methylstyrene, para-methylstyrene, vinyl toluene, para-t-butylstyrene, vinyl naphthalene and the like; bromo-substituted styrenes, especially p-vinyltoluene and ring brominated or dibrominated styrenes. Brominated styrenes are particularly useful in the preparation of ignition resistant syndiotactic vinylaromatic polymers. Alternatively, ignition resistant LCB-SVA polymers can be produced by brominating LCB-SVA polymers. Representative syndiotactic copolymers include styrene-p-methylstyrene, styrene-p-t-butylstyrene and styrene-vinyl toluene copolymers. Syndiotactic vinyl aromatic polymers and monomers made therefrom are known in the art having been previously disclosed in, for example, U.S. Pat. Nos. 4,680,353; 4,959,435; 4,950,724; and 4,774,301, included herein by reference. Syndiotactic polystyrene is the currently preferred syndiotactic vinyl aromatic polymer.

Long chain branching can be achieved by polymerizing a vinyl aromatic monomer in the presence of a small amount of a multifunctional monomer under conditions sufficient to produce a syndiotactic vinyl aromatic polymer. A multifunctional monomer is any compound having more than one olefinic functionality which can react with a vinyl aromatic monomer under polymerization conditions. Typically, the multifunctional monomer will contain 2–4 olefinic functionalities and is represented by formula (I):

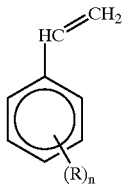

wherein R is a vinyl group or a group containing from 2 to 20 carbon atoms including a terminal vinyl group, wherein the groups containing 2 to 20 carbon atoms may be alkyl, alkenyl, cycloalkyl, or aromatic, wherein cycloalkyl groups contain at least 5 carbon atoms and aromatic groups contain at least 6 carbon atoms, n is an integer from 1 to 3 wherein the R groups are meta or para in relation to the vinyl group of formula (I), and when n is greater than 1, R may be the same or different. Preferably R is a vinyl group.

Preferably the multifunctional monomer contains two terminal vinyl groups wherein n would equal 1. Typically, such monomers include difunctional vinyl aromatic monomers such as divinyl benzene or distyryl-ethane and the like.

The amount of multifunctional monomer will depend upon the weight average molecular weight (Mw) of the polymer to be produced, but typically is from 10, preferably from 50, more preferably from 75, and most preferably from 100 ppm to 1000, preferably to 800, more preferably to 500, and most preferably to 650 ppm, based on the amount of vinyl aromatic monomer.

The multifunctional monomer can be introduced into the polymerization by any method which will allow the multifunctional monomer to react with the vinyl aromatic monomer during polymerization to produce a LCB-SVA polymer. For example, the multifunctional monomer can be first dissolved in the vinyl aromatic monomer prior to polymerization or introduced separately into the polymerization reactor before or during the polymerization. Additionally, the multifunctional monomer can be dissolved in an inert solvent used in the polymerization such as toluene or ethyl benzene.

Any polymerization process which produces syndiotactic vinyl aromatic polymers can be used to produce the LCB-SVA polymers of the present invention as long as a multifunctional monomer is additionally present during polymerization. Typical polymerization processes for producing syndiotactic vinyl aromatic polymers are well known in the art and are described in U.S. Pat. Nos. 4,680,353, 5,066,741, 5,206,197 and 5,294,685, which are incorporated herein by reference.

Typically, the weight average molecular weight (Mw) of the LCB-SVA polymer is from 50,000, preferably from 100,000, more preferably from 125,000, and most preferably from 150,000 to 3,000,000, preferably to 1,000,000, more preferably to 500,000 and most preferably to 350,000. When making fibers from compositions containing the LCB-SVA polymer, the molecular weight is preferably from 100,000 to 350,000.

A branched syndiotactic vinyl aromatic polymer contains extensions of syndiotactic vinyl aromatic polymer chain attached to the polymer backbone. A long chain branched syndiotactic vinyl aromatic polymer typically contains chain extensions of at least 10 monomer repeating units, preferably at least 100, more preferably at least 300, and most preferably at least 500 monomer repeating units.

Typically, the fibers of the present invention are produced from a composition of a LCB-SVA polymer without the presence of other polymers. However, fibers may be produced from compositions comprising a LCB-SVA polymer and other components including other polymers. The amount of LCB-SVA polymer contained within a composition for producing fibers is dependent upon the final application wherein advantages may be obtained with only small amounts in some instances. Generally, at least 5 percent by weight of a LCB-SVA polymer is used in a composition for producing fibers, typically at least 20 percent, preferably at least 40 percent, more preferably at least 70 percent and most preferably 100 percent. Other polymers which may be included in such compositions include but are not limited to linear SPS, polystyrene, polyphenylene oxide, brominated polyphenylene oxide such as polydibromophenylene oxide, polyolefins, such as polypropylene, polyethylene, poly(4-methylpentene), ethylene-propylene copolymers, ethylene-butene-propylene copolymers, nylons, e.g. nylon-6, nylon-6,6; polyesters, such as poly(ethylene terephthalate), poly(butylene terephthalate); and copolymers or blends thereof. Other materials or additives, including antioxidants, antiblock agents such as fine particles of alumina, silica, aluminosilicate, calcium carbonate, calcium phosphate, silicon resins, and the like; impact modifiers, ignition resistant agents and the like, coupling agents, for example maleated polymers, including maleic anhydride modified polyphenylene oxide, or maleic anhydride modified syndiotactic vinylaromatic polymers, binders to improve the wet strength of a base fabric, flame retardants including brominated polystyrene, brominated syndiotactic vinylaromatic polymers, antimony trioxide, and polytetrafluoroethylene may also be added to the LCB-SVA polymer composition, the fibers or articles made therefrom.

The fibers of the present invention can take many forms including, bi-component fibers with core sheath or similar configuration, hollow, starred or lobial shaped fibers. Typically, the length and diameter of the fibers will depend upon the final application and can vary from continuous lengths to about 0.1 mm or less. The fibers of the present invention can also have varying diameters. Advantageously, the LCB-SVA polymer can produce fibers having very low diameters such as diameters of $1\mu$ or less. Typically, the fibers will have a diameter of from about $0.3\mu$, preferably from about $0.5\mu$, more preferably from about $0.8\mu$ and most preferably from about $1\mu$ to about $10\mu$, preferably to about $8\mu$, more preferably to about $5\mu$ and most preferably to about $3\mu$. It has been surprisingly discovered that fibers made from LCB-SVA polymers can produce fibers having improved melt strength and lower diameters when compared to fibers of linear syndiotactic vinyl aromatic polymers.

Typically, fibers can be utilized to produce many different forms, wherein they can be formed into webs, mats, nonwovens, such as those defined in "*The Nonwoven Fabric Handbook*" 1992, pg. vii, Association of the Nonwoven Fabrics Industry, and *Nonwoven Fabric Primer and Reference Sampler,* produced by E. A. Vaughn, Clemson University, 1992, pg. 1–2, INDA, Association of the Nonwoven Industry; flashspun media, needlefelts, wet laid and dry laid media, or other fibrous intermediate articles. These types of intermediate articles include, but are not limited to, meltblown webs, thermally bonded webs, SMS (spunbond, meltblown, spunbond) laminated webs, crosslapped or needlepunched webs, electrostatic or hydrocharged webs, multidensity webs, bonded webs via thermal bonding, calendering, lamination stitchbonding, resin bonding, solvent bonding, mechanical bonding, spunlacing, jetlacing, hydroentangling, chemical bonding, latex bonding, powder bonding, print bonding, saturating, spray bonding, foam bonding, frothing, ultrasonically welding, and needlepunching or combinations thereof. Additionally, webs of other polymers can be combined with webs containing LCB-SVA fibers of the present invention to make a multilayer webbing which is especially useful in making filter articles.

Another aspect of the present invention is directed to articles made from LCB-SVA polymers, fibers and intermediate webs which include, but are not limited to, filtration media, wovens, fabrics, extruded netting and articles made therefrom. Other articles include, but are not limited to, bi-constituent composites, spunbonded media; string wound filter media, electrostatic or hydrocharged media, turboelectric type filter media, filters and filter components, e.g. liquid, or gas filters, coalescers, electrostatically charged filters, hydrocharged filters and turboelectric filters; separators for electrolytic cells, battery separators, surface veils, high temperature pipe wrap, cable wrap, acoustic and thermal insulation, blood barriers, personal protection fabrics, paper making filtration webs and paper support webs, electrical insulation fabric, roofing felt, medical products including protective clothing, protective barriers for sterile medical packaging, examination gowns, sterilizable filter webs and filters, surgical products, reinforcements for thermosets or thermoplastic polymers, pultruded articles, laminates, e.g. for printed wiring boards, or substrates of woven or non woven webs used in conjunction with thermosetting resins such as epoxies to form a printed circuit board laminate structure, and various articles which combine the use of the fibers of the present invention with films.

The articles of the present invention can be formed from 100% LCB-SVA polymer fibers, fibers from mixtures, alloys, or blends of LCB-SVA polymer with other polymers; or from a mixture of fibers. For example, other fibers can be combined with the fibers of the present invention, including glass fibers, carbon fibers, polyether ketone fibers, polyether ether ketone fibers, polyester imide fibers, polyimide fibers, wholly aromatic polyester fibers, polyphenylene sulfide fibers, aromatic polyamide fibers, aramid fibers, and ceramic fibers. Such fibers can be mixed with the fibers of the present invention by any conventional method including comingling continuous fiber bundles or mixing short-cut staple fibers in a wet laid process for example.

Processes to make fibers, webs, mats, fibrous materials and articles therefrom are well known in the art and include but are not limited to: methods defined in *Nonwoven Fabric Primer and Reference Sampler,* Produced by E. A. Vaughn, Clemson University, 1992, pgs. 4–6, INDA, Association of the Nonwoven Industry, and pgs. 45–64 of *The Nonwoven Fabric Handbook* 1992; Association of the Nonwoven Fabrics Industry, spinning, meltblowing, spunbonding, carding, air laying, wet laying, film aperturing, film fibrillating, flashspinning, needlepunching, thermal bonding, calendering, lamination, stitchbonding, resin bonding, solvent bonding, mechanical bonding, spunlacing, jetlacing, hydroentangling, chemical bonding, latex bonding, powder bonding, print bonding, saturating, spray bonding, foam bonding, frothing, ultrasonically welding, sheet extrusion, profile extrusion, pipe extrusion, netting extrusion, insert injection molding, pultrusion, pressure forming, thermoforming, laminating, filament winding, pour casting, resin transfer molding, sheet molding compound (SMC) processes, bulk molding compound (BMC) processes, and vacuum assisted resin transfer molding.

Optionally, the fibers, webs, mats or articles of the present invention can be modified with a variety of finishing techniques known in the art including those described on pages 72–76 of *The Nonwoven Fabric Handbook;* sulfonation, spin finishing utilizing lubricants, fatty acid esters, polyoxyethylenes, surfactants, flame retardants, antistatic agents, hydrophilic and or hydrophobic wetting agents, softeners and the like.

LCB-SVA polymers can also be used in other non-fiber applications including pipe and profile extrusions, powder coatings such as in powder coating of plain carbon steel or other strong, but less chemically stable materials. The fibers of the present invention can also be used in powder coatings after undergoing a size reduction process.

In one embodiment of the present invention, LCB-SVA polymer fibers are used to form a prepreg of a fibrous base material comprising LCB-SVA polymeric fibers and a resin composition comprising a thermosetting resin impregnated in the base material. LCB-SVA fibers are formed into a base material which may be a woven fabric, a knitted fabric, a nonwoven fabric or a paper-like sheet. Wet laid or dry laid and spun bonded fabrics are preferred due to the fibers' increased orientation and crystallinity compared to fabrics based on less-oriented fibers. Such fabrics may be calendered to improve porosity and impregnability of the thermosetting resin composition. A wetting agent may be included with the fibers to improve the dispersability thereof in a wet-laid process. Alternatively, the fibers may be dispersed in an epoxy resin composition, and a printed circuit board extruded or cast into a desired, optionally laminated or complex shaped article.

The fibrous base material may include other fibrous materials in addition to the LCB-SVA fibers. Preferred fibrous base materials comprise 2.5 to 100% by weight, preferably 5 to 100% by weight, of the LCB-SVA fibers and 97.5 to 0% by weight, preferably 95 to 0% by weight, of at least one other type of fiber. For example, the other fibers can be selected from glass fibers, carbon fibers, polyether ketone fibers, polyether ether ketone fibers, polyester imide fibers, polyimide fibers, wholly aromatic polyester fibers, polyphenylene sulfide fibers, aromatic polyamide fibers, aramid fibers, and ceramic fibers. Such fibers can be mixed with the LCB-SVA fibers by comingling continuous fiber bundles or mixing short-cut staple fibers in the wet laid process for forming of the base material. In a preferred embodiment the fabrics may be prepared by co-continuously spinning fibers or using wet or dry laid techniques with mixtures of glass or aramid fibers with LCB-SVA fibers. Additional ingredients to improve adhesion between fibers and/or the thermoset matrix such as coupling agents, for example maleated polymers, including maleic anhydride modified polyphenylene oxide, or maleic anhydride modified syndiotactic vinylaromatic polymers, or binders to improve the wet strength of the base fabric may be used. Additives, such as flame retardants including brominated polystyrene, brominated syndiotactic vinylaromatic polymers, antimony trioxide, and polytetrafluoroethylene may be added to the fibrous base material as well as to the thermosetting resin composition.

Suitable thermosetting resins used to form the prepreg include those resins known and used previously to form printed circuit board prepregs. Especially preferred resins include the well known epoxy resins, polyimide resins, cyanate-ester resins, bismaleimides-triazine resins and vinylester resins. Examples of suitable epoxy resins for use herein include:

(A) Diglycidyl ether compounds consisting of reaction products of at least one member selected from bisphenol A and halogenated bisphenol A with epichlorohydrin (for example, D.E.R.™ 592 A80 resin available from The Dow Chemical Company).

(B) Polyglycidylether compounds consisting of reaction products of polyhydric alcohol compounds consisting of reaction products of bisphenol A with an alkylene oxide in the presence of an acid or alkali catalyst, with epichlorohydrin (for example, EP-4000 supplied by Asahi-Denka).

(C) Phenol-novolak epoxy compounds (for example, Dow Epoxy Novolac D.E.N.™ 438).

(D) o-cresol-novolak epoxy compounds (for example, Epikote 180S65 supplied by Yuka-Shell Epoxy).

The curing agent contained in the epoxy resin composition is not particularly critical, but in general, at least one member selected from dicyandiamide compounds, aromatic polyamines, anhydrides and phenolic resins can be used.

A curing promoter can be further incorporated in the epoxy resin composition usable for the present invention. Imidazoles, imidazolines and tertiary phosphines such as triphenylphosphine are preferably used.

Suitable flame-retardant epoxy resin compositions usable for the prepreg include a mixture of a brominated bisphenol A epoxy resin which is a copolymerization product of tetrabromobisphenol A and bisphenol A with epichlorohydrin, with a heat-resistant o-cresol-novolak type epoxy resin and dicyandiamide as the curing agent. Preferred epoxy resins having improved heat resistance and good metal laminate peel resistance are resins comprising the reaction products of:

(I) at least one member selected from the group consisting of a glycidyl ether compounds consisting of reaction products of epichlorohydrin with polycondensation products of bisphenol A with formaldehyde, and a halogenated glycidyl ether compounds consisting of reaction products of epichlorohydrin with polycondensation products of halogenated bisphenol A with formaldehyde, with (II) at least one member selected from bisphenol A- and bisphenol F-type glycidyl ether compounds, and (III) at least one member selected from bisphenol A bisphenol F and tetrabromobisphenol A.

The thermosetting resin composition can be combined with various diluents for ease of application to the base material. For example, at least one member selected from acetone, methylethylketone, toluene, xylene, methylisobutylketone, ethyl acetate, ethylene glycol monomethyl ether, N,N'-dimethylformamide, N,N-dimethylacetamide, methanol and ethanol can be used. The resin composition is impregnated into the base material in any suitable manner such as by spraying, dipping, soaking, injecting, or otherwise coating the resin composition thereon.

The prepreg may be shaped or further modified by drilling or shaping and additional components, such as connectors, terminals or electronic components added prior to final curing.

Preferably, the weight ratio of the fibrous base material to the resin composition is from 20/80 to 90/10, preferably from 30/70 to 75/25, more preferably from 35/65 to 65/35.

The thermosetting resin may further comprise one or more additional ingredients such as a curing promoter, a lubricant, a flame retardant, a stabilizer, a release agent, an inorganic or organic filler, fine particles of a fluorine-containing polymer, a pigment, a dye, and the like.

The prepreg can also be prepared by impregnating the LCB-SVA fiber base material with the thermosetting resin composition, drying, and optionally, partially curing the resulting prepreg, if necessary, by customary procedures. The cured product results by initiating or completing crosslinking of the thermosetting resin, generally by heating the prepreg, optionally after further forming or shaping the prepreg into the desired shape. Alternatively the mixture comprising the fibers and thermosetting resin can be extruded into the desired shape and cured to form the desired cured prepreg.

A printed circuit board can be prepared by combining a predetermined number of prepregs, adding a copper foil on the surface of the prepreg or prepreg laminate, and integrally curing the laminate by heating under compression. A metal circuit layer can also be added by vapor deposition or by subsequent lamination of the metal layer to the surface of the cured prepreg and etching or machining the desired circuit design thereon.

What is claimed is:

1. Fibers made from a composition comprising a long chain branched syndiotactic vinyl aromatic polymer derived from the polymerization of a vinyl aromatic monomer in the presence of from 10 to 1000 ppm, based on the amount of vinyl aromatic monomer, of a multifunctional monomer having more than one olefinic functionality as represented by the formula

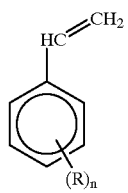

wherein R is a vinyl group or a group containing from 2 to 20 carbon atoms including a terminal vinyl group, wherein the groups containing 2 to 20 carbon atoms may be alkyl, alkenyl, cycloalkyl, or aromatic, wherein cycloalkyl groups contain at least 5 carbon atoms and aromatic groups contain at least 6 carbon atoms, n is an integer from 1 to 3 wherein the R groups are meta or para in relation to the vinyl group of formula (I), and when n is greater than 1, R may be the same or different.

2. The fibers of claim 1 wherein the vinyl aromatic polymer is styrene.

3. The fibers of claim 1 wherein the vinyl aromatic monomer is methylstyrene.

4. The fibers of claim 1 wherein the fibers are bi-component fibers.

* * * * *

UNITED STATES PATENT AND TRADEMARK OFFICE
CERTIFICATE OF CORRECTION

PATENT NO.   : 5,965,682
DATED        : October 12, 1999
INVENTOR(S)  : Curtis E. Peterson et al.

It is certified that error appears in the above-identified patent and that said Letters Patent is hereby corrected as shown below:

<u>Title Page</u>, column 2, References Cited, U.S. Patent Documents section, insert --5,021,288  6/1991  Jezic..........428/224--.

Column 8, claim 2, line 31, delete "polymer" and insert --monomer--.

Signed and Sealed this

Twenty-fourth Day of July, 2001

Attest:

*Nicholas P. Godici*

NICHOLAS P. GODICI
*Attesting Officer*     *Acting Director of the United States Patent and Trademark Office*